United States Patent
Bandyopadhyay et al.

(10) Patent No.: US 11,658,678 B2
(45) Date of Patent: May 23, 2023

(54) SYSTEM AND METHOD TO ENHANCE NOISE PERFORMANCE IN A DELTA SIGMA CONVERTER

(71) Applicant: Analog Devices, Inc., Wilmington, MA (US)

(72) Inventors: Abhishek Bandyopadhyay, Winchester, MA (US); Preston S. Birdsong, Medfield, MA (US); Adam R. Spirer, Westwood, MA (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 17/395,983

(22) Filed: Aug. 6, 2021

(65) Prior Publication Data

US 2022/0045694 A1 Feb. 10, 2022

Related U.S. Application Data

(60) Provisional application No. 63/063,546, filed on Aug. 10, 2020.

(51) Int. Cl.
*H03M 7/32* (2006.01)
*H03M 7/36* (2006.01)
*H03M 3/00* (2006.01)

(52) U.S. Cl.
CPC ......... *H03M 7/3011* (2013.01); *H03M 3/368* (2013.01); *H03M 3/412* (2013.01); *H03M 7/3017* (2013.01); *H03M 7/3022* (2013.01); *H03M 7/3042* (2013.01)

(58) Field of Classification Search
CPC ........ H01M 1/68; H03M 3/368; H03M 3/412; H03M 3/444; H03M 3/502; H03M 7/3011; H03M 7/3017; H03M 7/3042; H03M 7/3022
See application file for complete search history.

(56) References Cited

U.S. PATENT DOCUMENTS

| | | | |
|---|---|---|---|
| 6,697,004 B1 * | 2/2004 | Galton | H03M 1/066 341/143 |
| 6,873,218 B2 | 3/2005 | Khlat | |
| 6,940,436 B2 | 9/2005 | Hezar et al. | |
| 7,079,063 B1 | 7/2006 | Nguyen et al. | |
| 7,193,548 B2 * | 3/2007 | Kaplan | H03M 1/0665 341/118 |
| 7,277,035 B1 | 10/2007 | You et al. | |

(Continued)

OTHER PUBLICATIONS

Adams et al., *A 113-dB SNR Oversamplin DAC with Segmented Noise-Shaped Scrambling*, IEEE Journal of Solid-State Circuits, vol. 33, No. 12, Dec. 1998, 8 pages.

(Continued)

*Primary Examiner* — Lam T Mai
(74) *Attorney, Agent, or Firm* — Schwegman Lundberg & Woessner, P.A.

(57) ABSTRACT

Systems and methods for improving noise efficiency in a Delta Sigma modulator. A bypass scheme for a noise splitter is disclosed that reduces toggling activity for small signals. In particular, a sample-by-sample bypass noise splitter is disclosed that includes a noise splitting module and a bypass line. The bypass line bypasses the noise splitting module when signals are below a selected threshold, increasing efficiency of the system.

20 Claims, 7 Drawing Sheets

(56) References Cited

U.S. PATENT DOCUMENTS

| | | |
|---|---|---|
| 8,554,159 B2 | 10/2013 | van Waasen et al. |
| 8,953,813 B2 | 2/2015 | Loeda |
| 9,137,600 B2 | 9/2015 | Hetherington et al. |
| 9,172,393 B2* | 10/2015 | Stoops .................. H03M 3/502 |
| 9,178,529 B2 | 11/2015 | Dong et al. |
| 9,397,676 B1 | 7/2016 | Nguyen |
| 9,735,799 B1* | 8/2017 | Nguyen .................. H03M 1/06 |
| 9,768,800 B1 | 9/2017 | Nguyen |
| 9,955,250 B2 | 4/2018 | Hendrix et al. |
| 10,026,388 B2 | 7/2018 | Lu et al. |
| 10,110,242 B2 | 10/2018 | Liu |
| 10,931,299 B1* | 2/2021 | Kinyua ................ H03K 3/0315 |
| 2005/0168365 A1* | 8/2005 | Kaplan ............... H03M 1/0665 341/143 |
| 2010/0149012 A1 | 6/2010 | Nguyen et al. |
| 2010/0245142 A1* | 9/2010 | Myles ................ H03M 1/0665 341/144 |
| 2011/0273317 A1 | 11/2011 | Nagatani et al. |
| 2014/0145867 A1 | 5/2014 | Bandyopadhyay et al. |
| 2014/0240154 A1* | 8/2014 | Kim .................... H03M 7/3022 341/143 |
| 2015/0171891 A1* | 6/2015 | Stoops .................... H03M 3/50 341/143 |
| 2016/0072515 A1 | 3/2016 | Kinyua |
| 2018/0145697 A1* | 5/2018 | Crespi .................... G06F 3/165 |
| 2018/0229748 A1 | 8/2018 | Nakamura et al. |
| 2019/0229748 A1 | 7/2019 | Roh et al. |
| 2021/0305996 A1* | 9/2021 | Kinyua .................. H03M 1/164 |
| 2022/0029636 A1* | 1/2022 | Tripathi .................. H03M 3/37 |
| 2022/0094369 A1* | 3/2022 | Stepanovic ........... H03M 3/358 |

OTHER PUBLICATIONS

Bandyopadhyay et al., *A 120dB SNR 100db THD+N 21.5mW/channel multibit CT ΔΣ DAC*, ISSCC Dig. Tech. Papers, pp. 482-483, Feb. 2011.

"International Application Serial No. PCT/US2021/045127, International Search Report dated Nov. 3, 2021", 2 pgs.

"International Application Serial No. PCT/US2021/045127, Written Opinion dated Nov. 3, 2021", 10 pgs.

"International Application Serial No. PCT/US2021/045129, International Search Report dated Nov. 22, 2021", 2 pgs.

"International Application Serial No. PCT/US2021/045129, Written Opinion dated Nov. 22, 2021", 10 pgs.

"International Application Serial No. PCT/US2021/045127, International Preliminary Report on Patentability dated Feb. 23, 2023", 12 pgs.

"International Application Serial No. PCT/US2021/045129, International Preliminary Report on Patentability dated Feb. 23, 2023", 12 pgs.

\* cited by examiner

SYSTEM AND METHOD TO ENHANCE NOISE PERFORMANCE IN A DELTA SIGMA CONVERTER

CROSS REFERENCE TO RELATED APPLICATIONS

This application is related to and claims the benefit of priority under 35 U.S.C. § 119(e) to U.S. Provisional Patent Application No. 63/063,546 entitled "System and Method to Enhance Noise Performance in a Delta Sigma Converter" filed on Aug. 10, 2020, which is hereby incorporated by reference in its entirety. This application is also related to concurrently-filed application titled "System and Method to Enhance Noise Performance in a Delta Sigma Converter", which Application is incorporated herein by reference in its entirety into the disclosure of this application.

FIELD OF THE DISCLOSURE

The present invention relates to converters, and more specifically, to delta sigma converters.

BACKGROUND

Devices, such as class AB drivers, modulators, converters, and amplifiers, can be used in audio devices such as speakers and headphone drivers. Most of these applications are battery driven, and thus power consumption is an important parameter. These devices also need to meet high performance in terms of signal-to-noise ratio (SNR) and total harmonic distortion (THD). Typically, these applications have different modes of operation, such that one mode can be performance optimized and another can be power consumption optimized.

SUMMARY

Systems and method are provided for improving noise efficiency in a Delta Sigma modulator. A bypass scheme for a noise splitter is disclosed that reduces toggling activity for small signals. In particular, the bypass scheme allows the least significant bits of small signals to bypass the noise splitting module, increasing efficiency of the system.

According to one aspect, a sample-by-sample bypass noise splitter, comprises a noise splitting module configured to split an incoming signal into a plurality of split signals, wherein each of the plurality of split signals is smaller than the incoming signal; and a bypass line configured to pass the incoming signal directly through to an output line; wherein signals above a selected threshold are directed to the noise splitting module and wherein signals below the selected threshold are directed to the bypass line.

According to various implementations, the bypass line is configured to pass a set of least significant bits of the incoming signal through to the output line. IN some examples, the plurality of split signals includes a first signal including least significant bits of the incoming signal and a second signal including most significant bits of the incoming signal. In some implementations, the bypass noise splitter further includes a sigma delta loop configured to split the incoming signal. In some implementations, the noise splitting module includes an adder configured to truncate the incoming signal. In some implementations, the noise splitting module includes a clipper configured to perform first order sigma-delta modulation on an adder output. In some implementations, the noise splitting module includes a register configured to add a delay to a clipper output and further configured to feed back error to a next cycle.

According to some implementations, the bypass noise splitter further includes a first multiplexor in the noise splitting module and a second multiplexor in the bypass line, wherein the first multiplexor outputs processed most significant bits of the incoming signal and the second multiplexor outputs least significant bits of the incoming signal. In some implementations, when signals are below the selected threshold, the noise splitting module is disabled. In some implementations, the bypass noise includes a hold-off module, wherein signals below the selected threshold are directed to the hold-off module, and wherein the hold-off module is configured to postpone disabling the noise splitting module for a selected time period.

According to another aspect, a converter having enhanced noise performance includes an interpolator configured to receive an input signal; a noise splitter including a noise splitting module and a bypass line, configured to receive an interpolated signal and output a plurality of parallel output signals; a plurality of rotational scramblers coupled to the noise splitter configured to apply discrete element modeling to each of the plurality of parallel output signals and output a respective plurality of DEM output signals; and a plurality of 3-level digital-to-analog converters (DACs) coupled to the rotational scramblers configured to convert each of the plurality of DEM output signals to a respective analog signal; wherein the noise splitter is a sample-to-sample bypass splitter, and wherein signals above a selected threshold are directed to the noise splitting module and wherein signals below the selected threshold are directed to the bypass line.

In some implementations, signals are below the selected threshold, the noise splitter is configured to disable the noise splitting module. In some implementations, the noise splitter includes a hold-off module, wherein signals below the selected threshold are directed to the hold-off module, and wherein the hold-off module is configured to postpone disabling the noise splitting module for a selected time period.

The drawings show exemplary digital Class D driver circuits and configurations. Variations of these circuits, for example, changing the positions of, adding, or removing certain elements from the circuits are not beyond the scope of the present invention. The illustrated playback circuits, configurations, and complementary devices are intended to be complementary to the support found in the detailed description.

This overview is intended to provide an overview of subject matter of the present patent application. It is not intended to provide an exclusive or exhaustive explanation of the invention. Further limitations and disadvantages of conventional and traditional approaches will become apparent to one of skill in the art, through comparison of such systems with some aspects of the present invention as set forth in the remainder of the present application with reference to the drawings.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

For a fuller understanding of the nature and advantages of the present invention, reference is made to the following detailed description of preferred embodiments and in connection with the accompanying drawings, in which.

DETAILED DESCRIPTION

Systems and method are provided for improving noise efficiency in a Delta Sigma modulator. A bypass scheme is disclosed that reduces toggling activity for small signals. Additionally, systems and methods for a Delta-Sigma modulator are provided including introducing a new DAC cell that can be turned off when not in use, thereby improving power efficiency.

Figure 1:
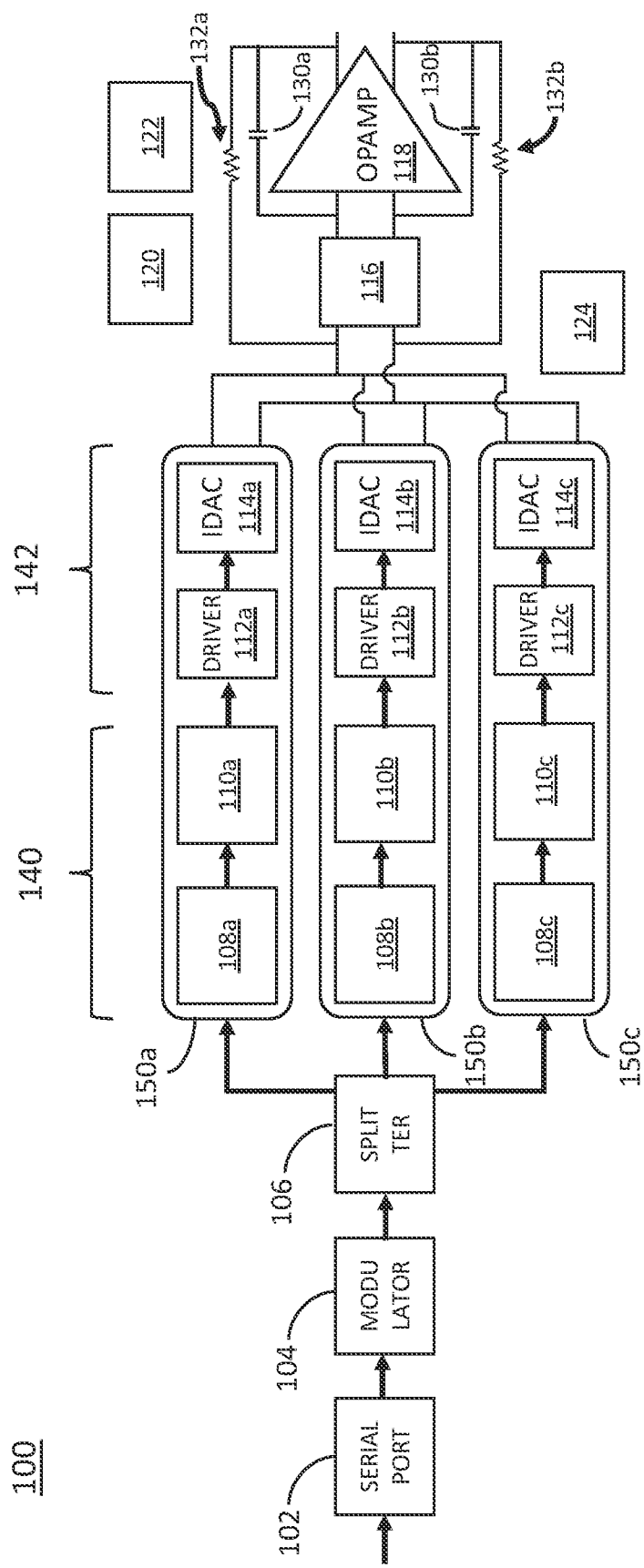
FIG. 1 depicts a system architecture for a digital to analog converter (DAC) playback path, according to various embodiments of the disclosure.

FIG. 1 depicts a system architecture for a continuous time (CT) digital to analog converter (DAC) playback path, according to various embodiments of the disclosure. The audio playback path 100 includes a serial port and interpolator 102, a modulator 104, and a noise-shaping splitter 106. A digital input signal is input to the serial port and interpolator 102. In various examples, the input signal includes multiple samples and bus widths. In one example, the input signal includes 24 bit input. The input signal is interpolated and input to the modulator 104. In some examples, the interpolation filter uses canonical signed digit arithmetic, and thus has low power consumption. In some examples, the modulator 104 is a second order modulator. In some examples, the modulator 104 is an eight bit modulator. The modulator output is input to the noise-shaping splitter 106. The noise shaping splitter 106 splits the signal into three parallel processing lines, and outputs a first sample set to a first line 150a, a second sample set to a second line 150b, and a third sample set to a third line 150c. In some examples, the noise shaping splitter 106 splits the signal into the three sample sets, and each of the first, second, and third sample sets has a different gain. In one example, the first sample set has a gain of 1×, the second sample set has a gain of 4×, and the third sample set has a gain of 16×. Splitting the signal at the noise shaping splitter reduces the number of elements and the overall area of the CT DAC playback path.

Each of the first 150a, second 150b, and third 150c parallel processing lines includes a sign-magnitude conversion element 108a, 108b, 108c, a rotational scrambler 110a, 110b, 110c, an I-DAC driver 112a, 112b, 112c, and an I-DAC 114a, 114b, 114c. In some examples, the I-DACs 114a, 114b, 114c are 2-level I-DACs, and in some examples, the I-DACs 114a, 114b, 114c are 3-level DACs. Note that the signal is a digital signal through to the rotational scrambler (section 140), which outputs a digital signal to the I-DAC driver 112a, 112b, 112c. According to various implementations, the audio playback path 100 depicts a 1st-order noise shaped segmentation technique. In some examples, the sign-magnitude conversion elements 108a, 108b, 108c perform sign magnitude thermometer code conversion. Following the conversion elements 108a, 108b, 108c, the one or more of the scramblers 110a, 110b, 110c apply individual discrete element modeling (DEM) to the signals in one or more of the respective parallel processing lines 150a, 150b, 150c. In various implementations, the DEM is rotational in nature. In some examples, the DEM is first order DEM, and in some examples, the DEM is higher order DEM such as second order DEM, third order DEM, or higher. In some examples, the CT DAC of FIG. 1 is part of an audio playback path including headphone and/or speaker drivers.

The outputs from the first 150a, second 150b, and third 150c parallel processing lines are input to ISI free switching element 116. The outputs are also connected to parallel resistors 132a, 132b connected to the playback line coo output. The switching element 116 output is input to an operational amplifier 118. On the right, the operational amplifier 118 and the resistors 132a, 132b dominate the noise contributions following the first 150a, second 150b, and third 150c parallel lines. The audio playback path 100 also includes an I-DAC bias generator 120, a bandgap element 122, and an ISI free clock generation 124. According to various implementations, the playback path 100 includes one or more elements described herein. The operational amplifier 118 and resistors 132a and 132b constitute a current to voltage converter which translate the overall current (provided by the current cells in the IDACs 214a, 214b, 241c,) to an output voltage. In some examples, the operational amplifier 118 is a class AB operational amplifier. In some examples, the operational amplifier 118 is a class D operational amplifier.

According to various implementations, the system shown in FIG. 1 includes a $1^{st}$-order noise shaped segmentation technique. In some examples, after a sign magnitude thermometer code conversion, individual rotational DEM is applied to each of the segmented data. The rotational DEM takes a mismatch for each of the current cells and does some shaping on it. Systems and methods are provided herein for improving the noise shaping splitter.

In traditional noise splitting modules, the bits received at the input line are split into two groups, decreasing the number of elements used. For example, an input signal of 6 bits is split into a 3 bit signal and a 4 bit signal, and the elements used decrease from $2^6$ to $2^3+2^4$. The noise splitting module shown in FIG. 1 shows a signal split into three parallel lines. For example, an 8-bit signal is split into three three-bit signals. In some examples, a first one of the parallel lines is a 1× current line, a second one of the parallel lines is a 4× current line, and a third one of the parallel lines is a 16× current line. The noise splitting module removes any gain mismatch between the parallel lines.

According to various implementations, systems and methods disclosed herein include a noise splitting module with two splits. In some examples, an 8 bit input signal is split into a 6-bit signal and a 3-bit signal. The 8 bit signal becomes a 9 bit signal upon splitting because of redundancy.

Figure 2:
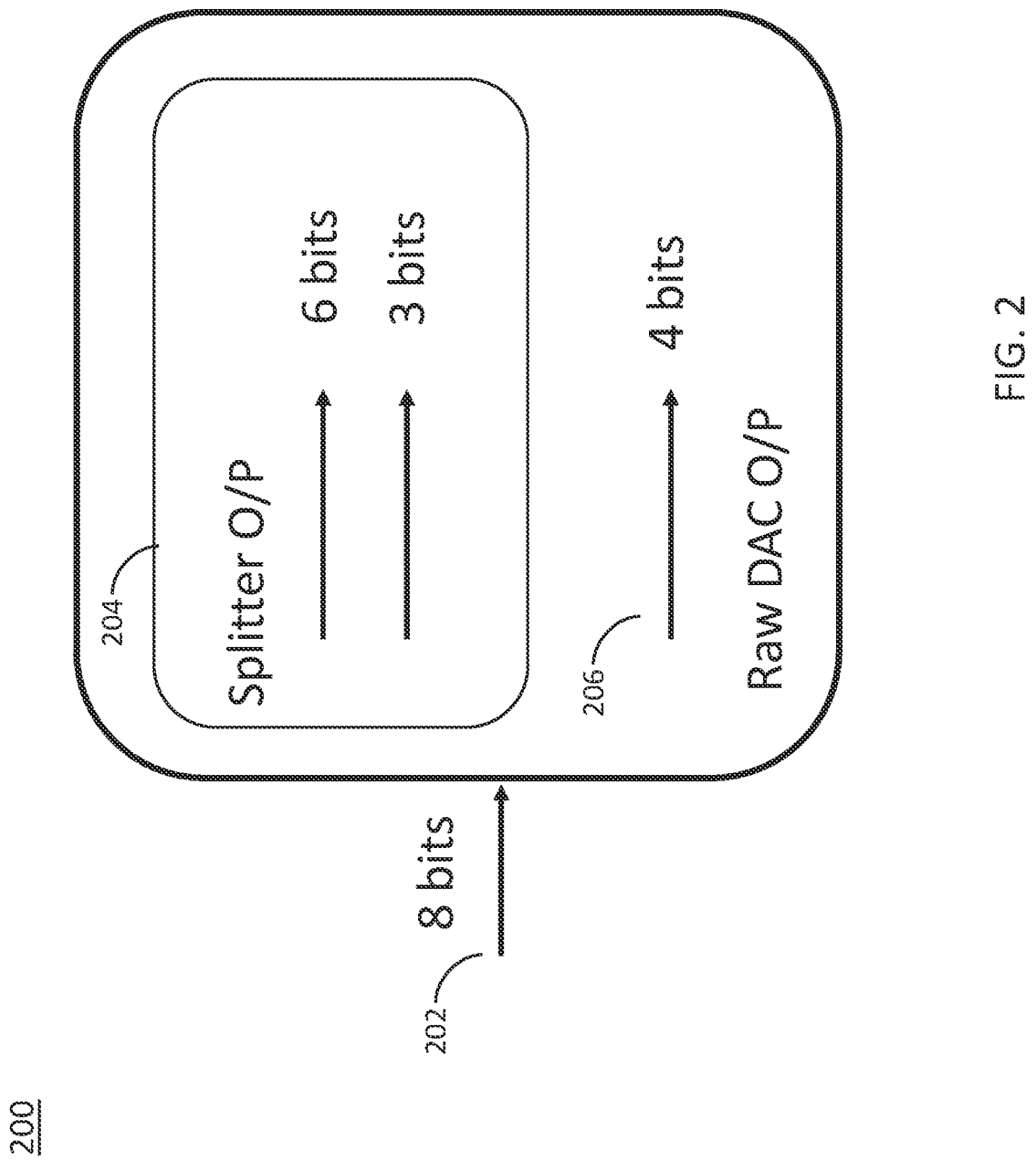
FIG. 2 shows an example of a sample-by-sample bypass splitter, according to various embodiments of the disclosure.

FIG. 2 shows an example of a sample-by-sample bypass splitter 200, according to various embodiments of the disclosure. The sample-by-sample bypass splitter 200 receives an 8-bit input signal 202, which can be directed to one of two output lines. The first output line is a noise splitter output line 204, and the second output line is a raw DAC output line 206. The bypass splitter 200 directs larger signals to the noise splitter output line 204, where the signal are split into a 3 bit signal and a 6 bit signal. The bypass splitter 200 directs small signals to the raw DAC output line 206, where the signals pass directly through the bypass splitter 200, bypassing the noise splitter output line 204. For a M bit input, the noise splitter, 204, outputs are M1 and M2, where each of M1 and M2 are smaller than M. The relationship of M=M1+M2 is maintained. In some examples, a sigma delta loop is used to split the signal for the noise splitter line 204. In some examples, higher order sigma delta loops can be used to generate M1, M2, . . . , Mn where the relationship of M=M1+M2+ . . . Mn is maintained.

For a small signal, only the least significant bits (LSBs) of the 8 bit input signal contain information, and these bits are passed through the noise splitter. In particular, the raw DAC output line 206 passes through 4 bits, the 4 least significant bits of the input signal 202. For an M bit input signal raw DAC output signal has N bits, where N<M, and N bits are derived from M by truncation of the N LSB bits. For a large input signal, both the least significant bits and the most significant bits (MSBs) contain information, so large input signals are split at the noise splitter output line 204, which splits the input signal into 6 bits and 3 bits, maintaining the input data integrity. The bypass splitter directs the signal either through the noise splitter line 204 or to the raw DAC line 206 on a sample-by-sample basis or in a continuous manner. In one example, if the signal is less than 3 codes, the raw DAC output line 206 is used, bypassing the noise splitter. If the signal is equal to or more than three codes, the noise splitter line 204 is used. In some examples, a code value is the digital input if the signal is equal to a value of three or more. In some examples, if the noise splitter 204 splits the input data M into M1 and M2, and the raw DAC output 206 has N bits, then it is possible to have M2=N or they may be different bit widths.

In some implementations, the noise splitter is continuously running, even when it is not being used, so that it is ready when a large signal arrives. At each clock cycle, it is determined whether the data signal goes through the noise splitter or the bypass line. In particular, based on the input at the interpolator 102, it can be determined whether the data signal will go through the noise splitter line 204 or the raw DAC bypass line 206. In some examples, the MSBs (most significant bits) are gated on the analog side.

According to some implementations, referring back to FIG. 1, the scramblers 110a, 110b, 110c include a dynamic element matching (DEM) module that is connected to the 6-bit data line in the noise splitter 106. In some examples, the DEMs are frozen at a previous state on the digital side. The input to the DEM depends on the data signal received at the bypass splitter.

Figure 3:
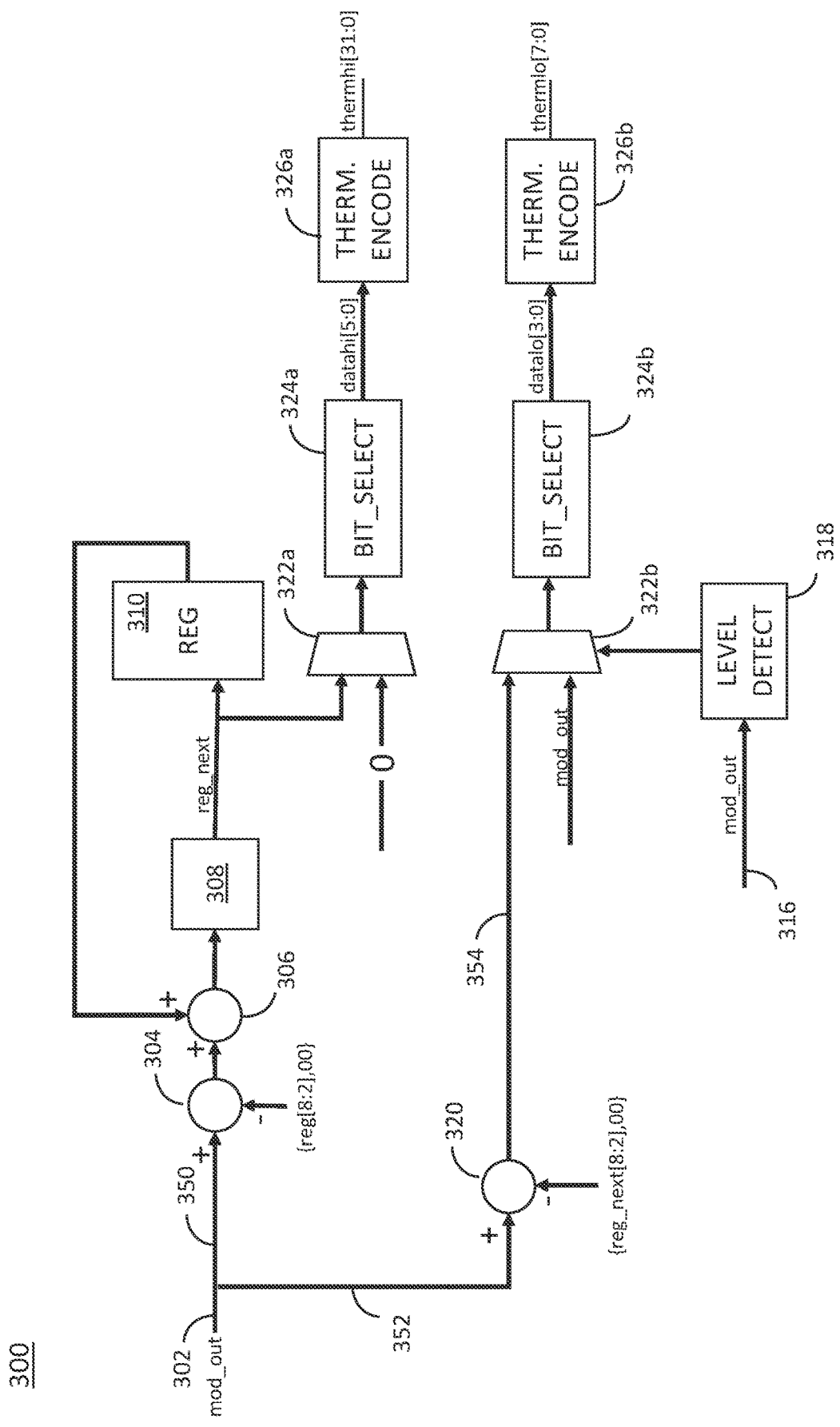
FIG. 3 shows an example of a DAC splitter bypass (DSB), according to various embodiments of the disclosure.

FIG. 3 shows an example of a DAC splitter bypass (DSB) 300, according to various embodiments of the disclosure. The input signal (mod_out) is received at the DAC bypass splitter 300 from a modulator. Referring to FIG. 1, before the modulator 104, at the interpolator 102, the incoming signal is evaluated to determine which line of the splitter 100 (DSB 300) will be used for the output from the modulator 104 (mod_out). In some examples, a latency is introduced at the interpolator 102 to make this determination. As described in greater detail below, the DAC splitter bypass 300 reduces noise and increases efficiency compared to a conventional noise splitter.

As shown in FIG. 3, the input signal 302 is mod_out. The adder 304 adds another input signal to the input signal 302, and this second input signal can be a fixed or random value. A clipper or a quantizer 308 performs truncation or quantization, to a lower number of bits, on the output from the second adder 306. The output from the clipper or quantizer 308 is input to the register 310 where a (z−1) delay is added for feeding the error back to the next cycle. The output from the clipper or quantizer 308 is also input to the first multiplexor 322a, and is called the first output 350. Additionally, the first output is subtracted from the input signal mod_out at a third adder 320, to prove a second output 354. Both branches together represent the signal. In some examples, the input signal 302 mod_out equals the first output 350 plus the second output 352. In this example, a first order delta sigma based splitter is shown. For higher order delta sigma based modulators, the register 310 will provide a filtered version of the first output 350 to the second adder 306. The output from the top branch 350 is input to the first multiplexor 322a, and the second output 354 is input to the second multiplexor 322b.

If the input signal mod_out level is low enough and can be represented using the low section of the split, then the noise shaping branch (at the top line 350) can be skipped and the entire input signal mod_out is fed to the bottom input line 352. In some examples, the input signal mod_out is input directly to the level detect module 318 and then to the second multiplexor 322b. Bypassing the noise shaping line (at the top line 350) saves power.

The output from the first 322a and second 322b multiplexors are input to first 324a and second 324b bit-select modules. The first bit-select module 324a outputs a 6-bit data-high signal, and the second bit-select module 324b output a 4-bit data low signal. The 6-bit data-high signal is input to a first thermometer encode module 326a, and the 4-bit data-low signal is input to a second thermometer encode module 326b. The first 326a and second 326b thermometer encode modules encode the data signals into individual bits to generate a one-hot signal, which is fed to the next stage of the circuit shown in FIG. 1.

According to various examples, the system determines which line of the bypass splitter 300 to use cycle-by-cycle. In one example, when the input data signal mod_out is less than or equal to three, the DAC output is assigned to the least significant bits (LSBs). The splitter 300 continues to run in the background, and output to the DEMs and scramblers 110a, 110b, 110c is gated. In some examples, the LSB DEM continuously operates.

In another implementation, when the input data signal mod_out is less than or equal to six, DAC output is assigned to the LSBs. The splitter 300 continues to run in the background, and the output to the DEMs and scramblers 110a, 110b, 110c is gated. The MSB DEM is frozen when the splitter 300 is in bypass mode, and the MSB DEM resumes when the splitter 300 is not in bypass mode. The LSB DEM continuously operates.

According to various implementations, there are multiple possible procedures for the DAC splitter bypass 300 to exit from the bypass mode and quickly reactivate the MSB splitter is defined. In a first example, the DSB 300 immediately reengages the MSB splitter when an incoming sample is above a set threshold. In a second example, in a DAC Dynamic Power (DDP) mode (discussed in more detail below), the exit procedure is initiated when a sample within a look ahead buffer exceeds a set threshold. The polarity of the data that triggers the exit procedure determines which segment is activated first. This is important because the DAC data value determines the MSB sequencing direction. The polarity of the data also determines which bit in the MSB array is used first. This allows the reengaging MSB cells maximum time prior to use, reducing the lookahead time. In some implementations, there are two groups of MSBs that can be powered down in event of small signal. In some examples, all 8 MSB cells in a group are controlled together and the groups are activated/deactivated sequentially. Thus, if the incoming signal is negative, the second group is activated first, whereas if the incoming signal is positive the first group is activated first. This polarity based sequence is designed to work with respect to the DEM that can go backwards (and wrap around) if the signal is negative.

Figure 4:
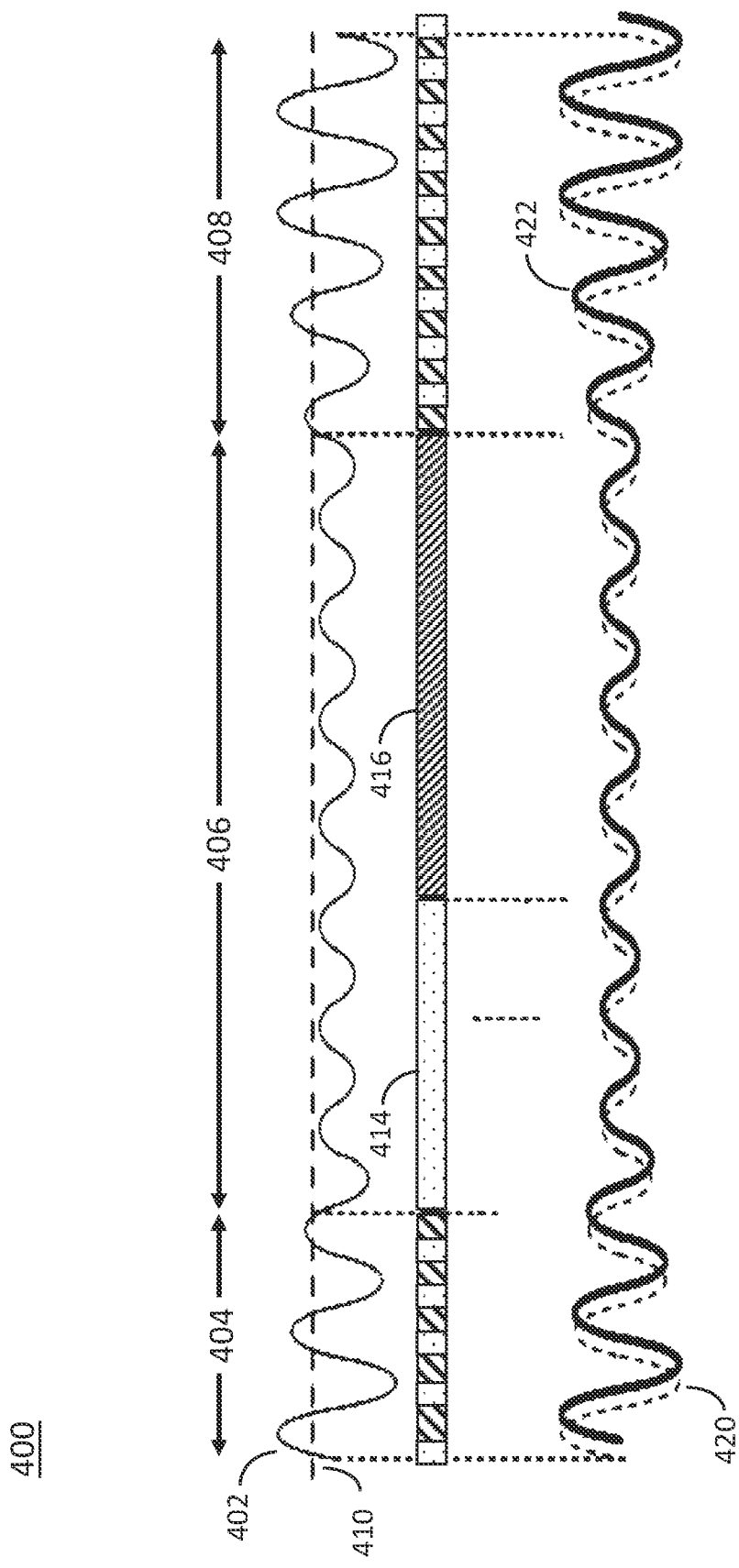
FIG. 4 shows an example of overall timing of the system, according to various embodiments of the disclosure.

FIG. 4 shows an example of overall timing of the system, according to various embodiments of the disclosure. As shown in FIG. 4, during a first window 404, the incoming data signal 402 is a big signal, greater than a selected threshold 410. Then, during a second window 406, the incoming signal 402 decreases and falls below the selected threshold 410. When the incoming data signal 402 becomes a small signal during the second window 406, the splitter bypass mode is engaged. To enter the splitter bypass mode, there is a threshold detector and/or envelope detector that detects whether the splitter is in big signal mode or small signal mode. Then, there is a hold off period 414 to determine whether the incoming signal 402 will remain small and the splitter can remain in small signal (low power) mode, before the splitter enters bypass mode during the bypass period 416.

As shown at the bottom of FIG. 4, there is a look-ahead, as shown by the dashed line 420, to determine if a big signal is coming. The bold line 422 shows the output/delayed signal. As shown in FIG. 4, there is a large signal coming on the left side of the figure, during the third window 408. The latency can be used to determine when the signal will increase above the threshold 410 and indicate mode switch. In the third window 408, the DAC bypass splitter returns to noise splitting mode. According to various implementations, some unique features are a data-dependent bit start, data dependent segment activation, fast activation abort sequence, and reversal of activation sequence before completion. According to some implementations, there is a reseed hold off (not shown) during which the DSB (bypass mode 416) is not triggered until the DEM reseeds (the start pointer and current pointer align and are moved).

DSB and DDP

Figure 5:
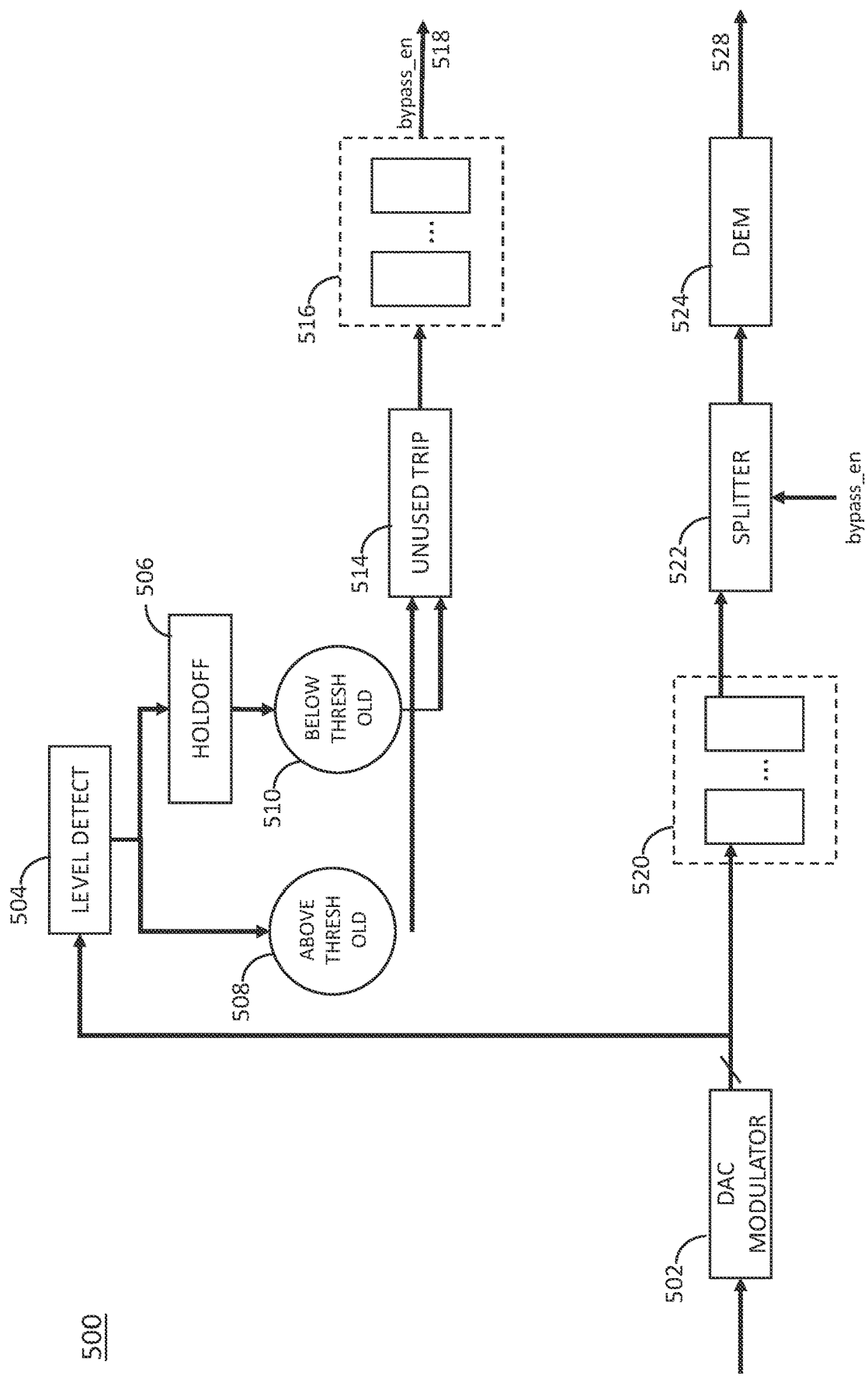
FIG. 5 shows a hold-off (and hold-on) system for a DAC Splitter Bypass (DSB) and a DAC Dynamic Power (DDP) mode, according to various embodiments of the disclosure.

FIG. 5 shows a hold-off (and hold-on) system 500 for a DAC Splitter Bypass (DSB) and a DAC Dynamic Power (DDP) mode, according to various embodiments of the disclosure. The input to the system 500 is to a DAC modulator 502. In some examples, the DAC modulator 502 is similar to the modulator 104 of FIG. 1. The output from the modulator 502 is split into multiple lines. A first line is connected to a level detector 504. The splitter bypass relies on level detection of input. The level detector 504 determines the level of the DAC modulator output. In general, the hold-off (and hold-on) system 500 illustrates a system for determining whether to enable the splitter bypass as well as a system for determining whether to power down one or more DAC cells in a DAC MSB cell segment module, such as MSB cell segment module 614 of FIG. 6A.

If the level is above a selected threshold, the signal from the level detector 504 is output to the above threshold module 508, which enables the splitter bypass 514. If the level at the level detector 504 is below a selected threshold, the signal from the level detector 504 is output to a holdoff 506. The holdoff delays disabling the of the high stage for a selected period of time. After the selected period of time, if the level of the signal continues to be below the selected threshold, the signal from the holdoff 506 is output to the below threshold module 510, which disables the high stage. In some examples, disabling the high stage, allows one or more cells in the MSB cell segment module of an upcoming DAC to be powered down. In some examples, disabling the high stage triggers use of the bypass line of the DAC splitter bypass 514. The DAC splitter bypass 514 outputs a bypass enable signal (bypass_en). The module 516 is a configurable hold-off delay.

The other lines from the DAC modulator are input to a delay 520, which allows a lookahead for DAC cell power controls. In particular, the delay provides warning of an upcoming large signal, allowing any DAC cells that had been powered down to be powered back up again. The DAC modulator output signals are then input to splitters 522, which also receive the bypass enable signal (bypass_en) output from the DSB trigger module 514. The splitters 522 use the bypass enable signal to determine whether the signal can bypass the noise splitting line, using just the least significant bits, as discussed above with respect to FIGS. 2 and 3. Thus, the splitters 522 output either truncated data or splitter data. The output from the splitters 522 is input to DEM modules 524, and DEM module outputs are input to DACs.

One advantage of the solutions shown herein are that they are lower power, higher performance, robust systems and methods to toggle between modes.

Examples of System Timing for DDP and DSB

Figure 6:
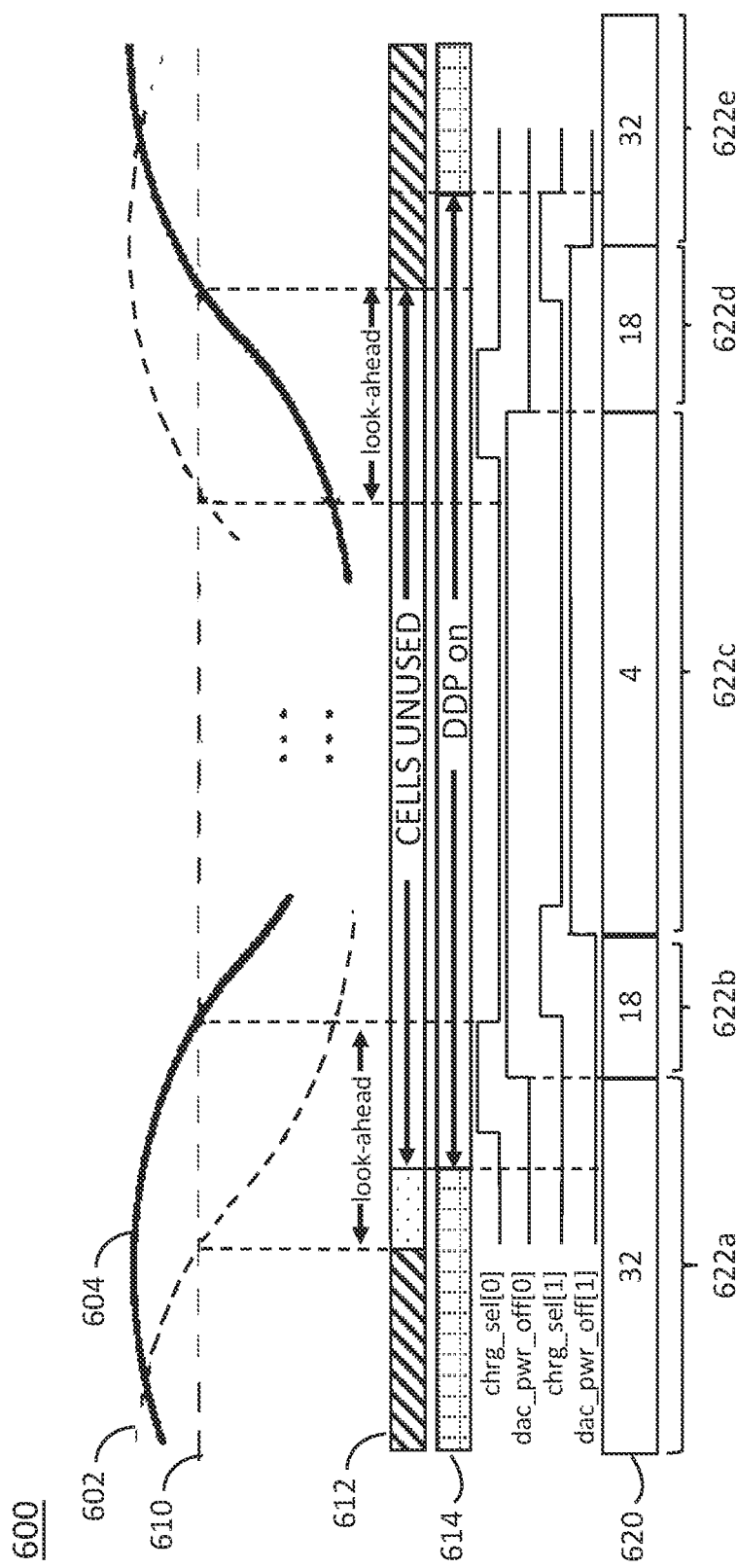
FIG. 6 show an example of overall timing of the DDP and DSB systems, according to various embodiments of the disclosure.

FIG. 6 show an example of overall timing of the DDP and DSB systems, according to various embodiments of the disclosure. As shown at the top of FIG. 6, a dashed line 602 represents the input/lookahead signal, and a solid line 604 represents the output/delayed signal. The straight dashed line 610 is the selected threshold, below which a DDP system enters a power saving mode, turning off one or more MSB cell segment module DACs. As shown in timing bar 614, shortly after the input/lookahead signal 602 drops below the threshold 601, DAC Dynamic Power mode is turned on. Similarly, shortly after the input/lookahead signal 602 drops below the threshold 601, the DSB bypass mode is turned on.

The bottom line 620 in FIG. 6 lists the number of DAC cells powered on in a DDP mode system. During a first time period 622a, 32 DAC cells are powered on. Then, a dac_pwr_off[0] signal is turned on, triggering powering off of 14 MSB cell segment module DACs. Thus, during a second time period 622b in the bottom line 620, 18 DAC cells are powered on. Then, a second dac_pwr_off[1] signal is turned on, triggering powering off of 14 more MSB cell segment module DACs. Thus, during a third time period 622c in the bottom line 620, 4 DAC cells are powered on. At the end of the third time period 622c, the dac_pwr_off[0] signal is turned off, and, in the fourth time period 622d, 14 DAC cells are turned back on, resulting in 18 DAC cells being powered on. At the end of the fourth time period 622d, the dac_pwr_off[1] signal is turned off, and, in the fifth time period 622e, 14 more DAC cells are turned back on, resulting in 32 DAC cells being powered on. During the fifth time period 622e, the DDP mode is turned off.

One advantage of the solutions shown herein are that they are lower power, higher performance, robust systems and methods to toggle between modes.

Variations and Implementations

Figure 7:
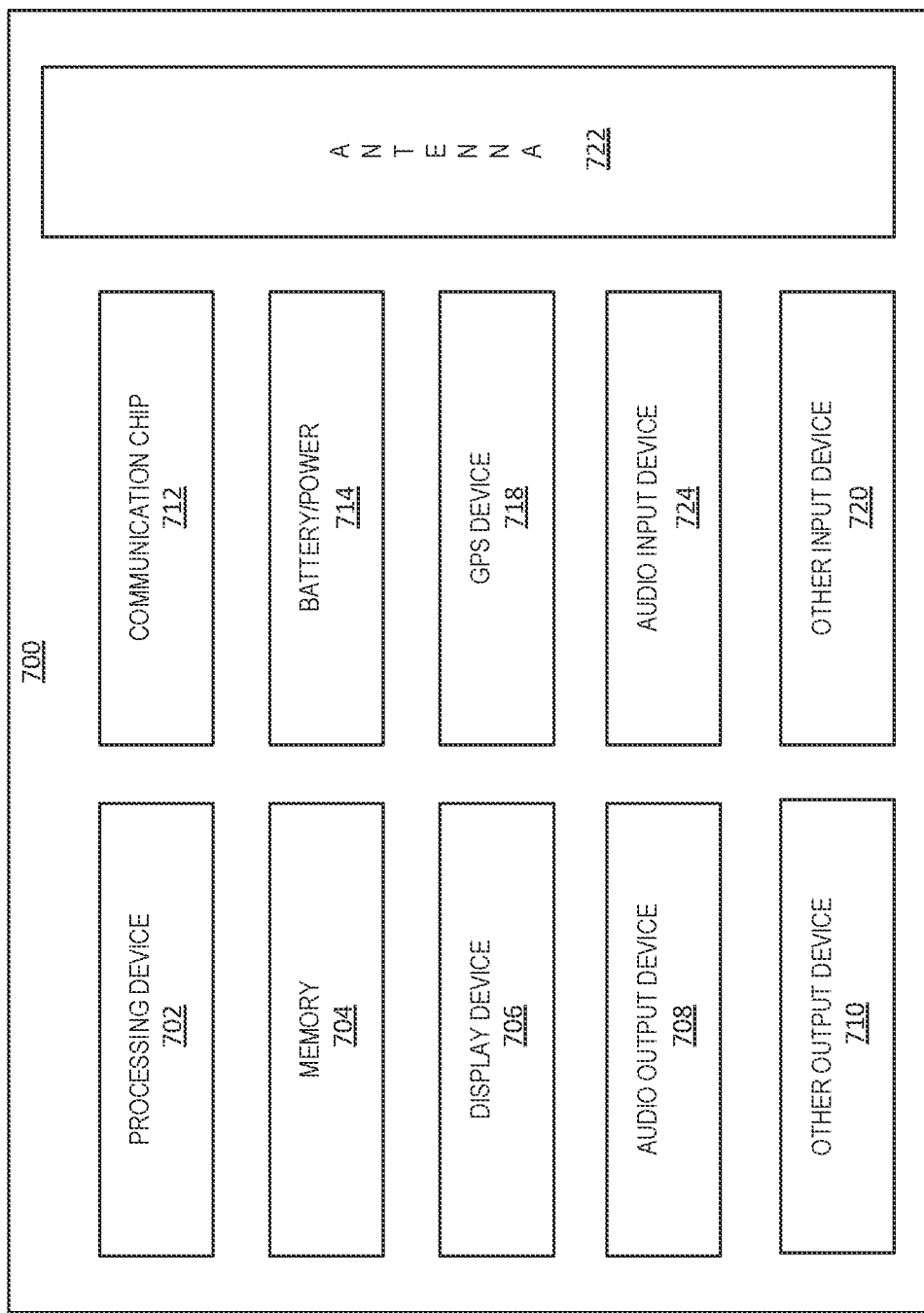
FIG. 7 is a block diagram of an example electrical device that may include one or more class D drivers, in accordance with any of the embodiments disclosed herein.

FIG. 7 is a block diagram of an example electrical device 700 that may include one or more class D drivers, in accordance with any of the embodiments disclosed herein. A number of components are illustrated in FIG. 7 as included in the electrical device 700, but any one or more of these components may be omitted or duplicated, as suitable for the application. In some embodiments, some or all of the components included in the electrical device 700 may be attached to one or more motherboards. In some embodiments, some or all of these components are fabricated onto a single system-on-a-chip (SoC) die.

Additionally, in various embodiments, the electrical device 700 may not include one or more of the components illustrated in FIG. 7, but the electrical device 700 may include interface circuitry for coupling to the one or more components. For example, the electrical device 700 may not include a display device 706, but may include display device interface circuitry (e.g., a connector and driver circuitry) to which a display device 706 may be coupled. In another set of examples, the electrical device 700 may not include an audio input device 724 or an audio output device 708, but may include audio input or output device interface circuitry (e.g., connectors and supporting circuitry) to which an audio input device 724 or audio output device 708 may be coupled.

The electrical device 700 may include a processing device 702 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 702 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 700 may include a memory 704, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 704 may include memory that shares a die with the processing device 702. This memory may be used as cache memory and may include embedded dynamic random access memory (eDRAM) or spin transfer torque magnetic random access memory (STT-MRAM).

In some embodiments, the electrical device 700 may include a communication chip 712 (e.g., one or more communication chips). For example, the communication chip 712 may be configured for managing wireless communications for the transfer of data to and from the electrical device 700. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 712 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 712 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 712 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 712 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 712 may operate in accordance with other wireless protocols in other embodiments. The electrical device 700 may include an antenna 722 to facilitate wireless communications and/or to receive other wireless communications (such as AM or FM radio transmissions).

In some embodiments, the communication chip 712 may manage wired communications, such as electrical, optical, or any other suitable communication protocols (e.g., the Ethernet). As noted above, the communication chip 712 may include multiple communication chips. For instance, a first communication chip 712 may be dedicated to shorter-range wireless communications such as Wi-Fi or Bluetooth, and a second communication chip 712 may be dedicated to longer-range wireless communications such as global positioning system (GPS), EDGE, GPRS, CDMA, WiMAX, LTE, EV-DO, or others. In some embodiments, a first communication chip 712 may be dedicated to wireless communications, and a second communication chip 712 may be dedicated to wired communications.

The electrical device 700 may include battery/power circuitry 714. The battery/power circuitry 714 may include one or more energy storage devices (e.g., batteries or capacitors) and/or circuitry for coupling components of the electrical device 700 to an energy source separate from the electrical device 700 (e.g., AC line power).

The electrical device 700 may include a display device 706 (or corresponding interface circuitry, as discussed above). The display device 706 may include any visual indicators, such as a heads-up display, a computer monitor, a projector, a touchscreen display, a liquid crystal display (LCD), a light-emitting diode display, or a flat panel display.

The electrical device 700 may include an audio output device 708 (or corresponding interface circuitry, as discussed above). The audio output device 708 may include any device that generates an audible indicator, such as speakers, headsets, or earbuds.

The electrical device 700 may include an audio input device 724 (or corresponding interface circuitry, as discussed above). The audio input device 724 may include any device that generates a signal representative of a sound, such as microphones, microphone arrays, or digital instruments (e.g., instruments having a musical instrument digital interface (MIDI) output).

The electrical device 700 may include a GPS device 710 (or corresponding interface circuitry, as discussed above). The GPS device 710 may be in communication with a satellite-based system and may receive a location of the electrical device 700, as known in the art.

The electrical device 700 may include another output device 710 (or corresponding interface circuitry, as discussed above). Examples of the other output device 710 may include an audio codec, a video codec, a printer, a wired or wireless transmitter for providing information to other devices, or an additional storage device.

The electrical device 700 may include another input device 720 (or corresponding interface circuitry, as discussed above). Examples of the other input device 720 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 700 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 700 may be any other electronic device that processes data.

Select Examples

Example 1 provides a sample-by-sample bypass noise splitter, comprising: a noise splitting module configured to split an incoming signal into a plurality of split signals, wherein each of the plurality of split signals is smaller than the incoming signal; and a bypass line configured to pass the incoming signal directly through to an output line; wherein signals above a selected threshold are directed to the noise splitting module and wherein signals below the selected threshold are directed to the bypass line.

Example 2 provides a bypass noise splitter according to any of the preceding and/or following examples, wherein the bypass line is configured to pass a set of least significant bits of the incoming signal through to the output line.

Example 3 provides a bypass noise splitter according to any of the preceding and/or following examples, wherein the plurality of split signals includes a first signal including least significant bits of the incoming signal and a second signal including most significant bits of the incoming signal.

Example 4 provides a bypass noise splitter according to any of the preceding and/or following examples, further comprising a sigma delta loop configured to split the incoming signal.

Example 5 provides a bypass noise splitter according to any of the preceding and/or following examples, wherein the noise splitting module includes an adder configured to truncate the incoming signal.

Example 6 provides a bypass noise splitter according to any of the preceding and/or following examples, wherein the sigma delta loop is a one of a first order sigma delta loop and a higher-order sigma delta loop; the sigma delta loop is configured to split the input signal into a plurality of component outputs; and a sum of the plurality of component outputs equals the input signal.

Example 7 provides a bypass noise splitter according to any of the preceding and/or following examples, wherein the noise splitting module includes an adder configured to add a second signal to the input signal.

Example 8 provides a bypass noise splitter according to any of the preceding and/or following examples, wherein the adder is a first adder and wherein the noise splitting module includes a second adder and a quantizer configured to truncate a second adder output to provide a first output Example 9 provides a bypass noise splitter according to any of the preceding and/or following examples, wherein the noise splitting module includes a register configured to filter a quantizer output and further configured to feed back a filtered quantizer output and add the filtered quantizer output to a first adder output.

Example 10 provides a bypass noise splitter according to any of the preceding and/or following examples, wherein the register is configured to utilize a second adder on a subsequent cycle to add the filtered quantizer output to the first adder output.

Example 11 provides a bypass noise splitter according to any of the preceding and/or following examples, wherein the bypass line further comprises a third adder configured to process the input signal and a first output to generate a second output.

Example 12 provides a bypass noise splitter according to any of the preceding and/or following examples, the noise splitting module further comprises a first multiplexor, wherein the first multiplexor is configured to process a first output, and the bypass line further comprises a second multiplexor, and wherein the second multiplexor is configured to process a second output and least significant bits of the input signal.

Example 13 provides a bypass noise splitter according to any of the preceding and/or following examples, wherein when signals are below the selected threshold, the noise splitting module is disabled and the first multiplexor is configured to output a zero, and the second multiplexor is configured to output the least significant bits of the input signal.

Example 14 provides a bypass noise splitter according to any of the preceding and/or following examples, wherein when signals are below the selected threshold, the noise splitting module is disabled.

Example 15 provides a bypass noise splitter according to any of the preceding and/or following examples, further comprising a hold-off module, wherein signals below the selected threshold are directed to the hold-off module, and wherein the hold-off module is configured to postpone disabling the noise splitting module for a selected time period.

Example 16 provides a bypass noise splitter according to any of the preceding and/or following examples, wherein a first split signal of the plurality of split signals includes a first number of least significant bits, wherein the bypass line is configured to pass through a second number of least significant bits of the input signal, and wherein the first number of least significant bits is different from the second number of least significant bits.

Example 17 provides a bypass noise splitter according to any of the preceding and/or following examples, wherein the noise splitting module includes a clipper configured to perform first order sigma-delta modulation on an adder output.

Example 18 provides a bypass noise splitter according to any of the preceding and/or following examples, further comprising wherein the noise splitting module includes a register configured to add a delay to a clipper output and further configured to feed back error to a next cycle.

Example 19 provides a bypass noise splitter according to any of the preceding and/or following examples, further comprising a first multiplexor in the noise splitting module and a second multiplexor in the bypass line, wherein the first multiplexor outputs processed most significant bits of the incoming signal and the second multiplexor outputs least significant bits of the incoming signal.

Example 20 provides a bypass noise splitter according to any of the preceding and/or following examples, wherein when signals are below the selected threshold, the noise splitting module is disabled.

Example 21 provides a bypass noise splitter according to any of the preceding and/or following examples, further comprising a hold-off module, wherein signals below the selected threshold are directed to the hold-off module, and wherein the hold-off module is configured to postpone disabling the noise splitting module for a selected time period.

Example 22 provides a converter having enhanced noise performance, comprising: an interpolator configured to receive an input signal; a noise splitter including a noise splitting module and a bypass line, configured to receive an interpolated signal and output a plurality of parallel output signals; a plurality of rotational scramblers coupled to the noise splitter configured to apply discrete element modeling to each of the plurality of parallel output signals and output a respective plurality of DEM output signals; and a plurality of 3-level digital-to-analog converters (DACs) coupled to the rotational scramblers configured to convert each of the plurality of DEM output signals to a respective analog signal; wherein the noise splitter is a sample-to-sample bypass splitter, and wherein signals above a selected threshold are directed to the noise splitting module and wherein signals below the selected threshold are directed to the bypass line.

Example 23 provides a converter according to any of the preceding and/or following examples, wherein when signals are below the selected threshold, the noise splitter is configured to disable the noise splitting module.

Example 24 provides a converter according to any of the preceding and/or following examples, wherein the noise splitter includes a hold-off module, wherein signals below the selected threshold are directed to the hold-off module, and wherein the hold-off module is configured to postpone disabling the noise splitting module for a selected time period.

Example 25 provides a method for a sample-by-sample bypass noise splitter, comprising: receiving an input signal; determining whether the input signal is above a selected threshold; when the input signal is above the selected threshold: splitting the input signal into a plurality of split signals, wherein each of the plurality of split signals is smaller than the input signal; and when the input signal is below the selected threshold: passing the input signal directly through to an output line.

Example 26 provides a method according to any of the preceding and/or following examples, wherein passing the input signal directly through to the output line comprises passing a set of least significant bits of the input signal through to the output line.

Example 27 provides a 3-level digital-to-analog converter (DAC), comprising: a plurality of current sources each having a current flow, wherein the plurality of current sources includes a first subset of current sources and a second subset of current sources; a first positive current path for the first subset of current sources, wherein the first positive current path includes a first switch; a first negative current path for the first subset of current sources, wherein the first positive current path includes a second switch; a zero-state current path for a first portion of the first subset of current sources, wherein the zero-state current path is a dump path, and wherein the zero-state current path includes a third switch; and a bypass current path for a second portion of the first subset of current sources, wherein the zero-state current path includes a fourth switch, wherein the fourth switch is closed when the third switch is closed, and wherein the bypass current path is configured to shunt the second portion of current sources from the dump path, thereby keeping the DAC powered on.

Example 28 provides a converter according to any of the preceding and/or following examples, further comprising a second positive current path for the second subset of current sources, wherein the second positive current path includes a fifth switch, and wherein the fifth switch is closed when the first switch is closed.

Example 29 provides a converter according to any of the preceding and/or following examples, further comprising a positive output, wherein the positive output includes a first positive current path output and a second positive current path output.

Example 30 provides a converter according to any of the preceding and/or following examples, further comprising a second negative current path for the second subset of current sources, wherein the second negative current path includes a sixth switch, and wherein the sixth switch is closed when the second switch is closed.

Example 31 provides a converter according to any of the preceding and/or following examples, further comprising a negative output, wherein the negative output includes a first negative current path output and a second negative current path output.

Example 32 provides a converter according to any of the preceding and/or following examples, further comprising a zero-state current path for the second subset of current sources, wherein the second zero-state current path includes a seventh switch, and wherein the seventh switch is closed when the third switch is closed.

Example 33 provides a converter according to any of the preceding and/or following examples, wherein the plurality of current sources include outputs from a discrete element model module.

Example 34 provides a system for converting a digital signal to an analog signal, comprising an input signal; a first plurality of digital-to-analog converter (DAC) cells coupled to the input signal, wherein the first plurality of DAC cells remain powered on; a second plurality of DAC cells, wherein ones of the second plurality of DAC cells are configured to be powered down when the input signal is below a selected threshold; a charge amplifier configured to provide charge to powered down DAC cells of the second plurality of DAC cells; and a multiplexor, coupled to the charge amplifier and the second plurality of DAC cells, wherein, when the input signal rises above the selected threshold, the multiplexor is configured to connect the charge amplifier charge to powered down DAC cells of the second plurality of DAC cells, wherein the charge amplifier charge powers up the powered down DAC cells of the second plurality of DAC cells.

Example 35 provides a system according to any of the preceding and/or following examples, further comprising a look-ahead element for determining when the input signal will rise above the selected threshold.

Example 36 provides a system according to any of the preceding and/or following examples, further comprising a filter coupled to the first plurality of DAC cells, wherein the multiplexor is further coupled to the filter.

Example 37 provides a system according to any of the preceding and/or following examples, wherein a multiplexor input is one of the charge amplifier charge and a filter output.

Example 38 provides a system for a noise splitter including a noise splitting module and a bypass line.

Example 39 provides a system according to example 1, including a plurality of 3-level DAC.

Example 40 provides a system according to any of the preceding examples, wherein the noise splitter is a sample-to-sample bypass splitter, and wherein signals above a selected threshold are directed to the noise splitting module and wherein signals below the selected threshold are directed to the bypass line.

Example 41 provides a system according to any of the preceding examples, wherein the bypass line bypasses the noise splitter module.

Example 42 provides a system according to any of the preceding examples, wherein the bypass line receives a plurality of lower bits of the input signal.

Example 43 provides a system according to any of the preceding examples, wherein the system includes multiple DACs, and wherein, in a power saving mode, a first plurality of DACs are turned off and a second plurality of DACs are turned on.

Example 44 provides a system according to any of the preceding examples, wherein look-aheads are used to determine when to turn on and/or off the first plurality of DACs.

Example 45 provides a system according to any of the preceding examples, include a continuous time DAC.

Example 46 provides a system according to any of the preceding examples, including a discrete time DAC.

Example 47 provides a system according to any of the preceding examples, including an ADC.

Example 48 includes a system or an apparatus that includes a converter as discussed or depicted in any of examples 1-10, some other example, or as otherwise discussed or depicted herein.

Example 49 includes an apparatus comprising means to implement a converter as discussed or depicted in any of examples 1-10, some other example, or as otherwise discussed or depicted herein.

Example 50 includes a method for implementing or manufacturing a converter as discussed or depicted in any of examples 1-10, some other example, or as otherwise discussed or depicted herein.

Example 51 includes one or more non-transitory computer-readable media comprising instructions that, upon execution of the instructions by an electronic device, are to cause the electronic device to implement or manufacture a converter as discussed or depicted in any of examples 1-10, some other example, or as otherwise discussed or depicted herein.

In the preceding discussion, reference may be made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the preceding detailed description is not to be taken in a limiting sense.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an application specific integrated circuit (ASIC), an electronic circuit, a processor (shared, dedicated, or group) or memory (shared, dedicated, or group) that execute one or more software or firmware programs, a combinational logic circuit, or other suitable components that provide the described functionality.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein.

Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The foregoing outlines features of one or more embodiments of the subject matter disclosed herein. These embodiments are provided to enable a person having ordinary skill in the art (PHOSITA) to better understand various aspects of the present disclosure. Certain well-understood terms, as well as underlying technologies and/or standards may be referenced without being described in detail. It is anticipated that the PHOSITA will possess or have access to background knowledge or information in those technologies and standards sufficient to practice the teachings of the present disclosure.

The PHOSITA will appreciate that they may readily use the present disclosure as a basis for designing or modifying other processes, structures, or variations for carrying out the same purposes and/or achieving the same advantages of the embodiments introduced herein. The PHOSITA will also recognize that such equivalent constructions do not depart from the spirit and scope of the present disclosure, and that they may make various changes, substitutions, and alterations herein without departing from the spirit and scope of the present disclosure.

The above-described embodiments may be implemented in any of numerous ways. One or more aspects and embodiments of the present application involving the performance of processes or methods may utilize program instructions executable by a device (e.g., a computer, a processor, or other device) to perform, or control performance of, the processes or methods.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above.

The computer readable medium or media may be transportable, such that the program or programs stored thereon may be loaded onto one or more different computers or other processors to implement various ones of the aspects described above. In some embodiments, computer readable media may be non-transitory media.

Note that the activities discussed above with reference to the FIGURES which are applicable to any integrated circuit that involves signal processing (for example, gesture signal processing, video signal processing, audio signal processing, analog-to-digital conversion, digital-to-analog conversion), particularly those that can execute specialized software programs or algorithms, some of which may be associated with processing digitized real-time data.

In some cases, the teachings of the present disclosure may be encoded into one or more tangible, non-transitory computer-readable mediums having stored thereon executable instructions that, when executed, instruct a programmable device (such as a processor or DSP) to perform the methods or functions disclosed herein. In cases where the teachings herein are embodied at least partly in a hardware device (such as an ASIC, IP block, or SoC), a non-transitory medium could include a hardware device hardware-programmed with logic to perform the methods or functions disclosed herein. The teachings could also be practiced in the form of Register Transfer Level (RTL) or other hardware description language such as VHDL or Verilog, which can be used to program a fabrication process to produce the hardware elements disclosed.

In example implementations, at least some portions of the processing activities outlined herein may also be implemented in software. In some embodiments, one or more of these features may be implemented in hardware provided external to the elements of the disclosed figures, or consolidated in any appropriate manner to achieve the intended functionality. The various components may include software (or reciprocating software) that can coordinate in order to achieve the operations as outlined herein. In still other embodiments, these elements may include any suitable algorithms, hardware, software, components, modules, interfaces, or objects that facilitate the operations thereof.

Any suitably-configured processor component can execute any type of instructions associated with the data to achieve the operations detailed herein. Any processor disclosed herein could transform an element or an article (for example, data) from one state or thing to another state or thing. In another example, some activities outlined herein may be implemented with fixed logic or programmable logic (for example, software and/or computer instructions executed by a processor) and the elements identified herein could be some type of a programmable processor, programmable digital logic (for example, an FPGA, an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof.

In operation, processors may store information in any suitable type of non-transitory storage medium (for example, random access memory (RAM), read only memory (ROM), FPGA, EPROM, electrically erasable programmable ROM (EEPROM), etc.), software, hardware, or in any other suitable component, device, element, or object where appropriate and based on particular needs. Further, the information being tracked, sent, received, or stored in a processor could be provided in any database, register, table, cache, queue, control list, or storage structure, based on particular needs and implementations, all of which could be referenced in any suitable timeframe.

Any of the memory items discussed herein should be construed as being encompassed within the broad term 'memory.' Similarly, any of the potential processing elements, modules, and machines described herein should be construed as being encompassed within the broad term 'microprocessor' or 'processor.' Furthermore, in various embodiments, the processors, memories, network cards, buses, storage devices, related peripherals, and other hardware elements described herein may be realized by a processor, memory, and other related devices configured by software or firmware to emulate or virtualize the functions of those hardware elements.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a personal digital assistant (PDA), a smart phone, a mobile phone, an iPad, or any other suitable portable or fixed electronic device.

Also, a computer may have one or more input and output devices. These devices can be used, among other things, to present a user interface. Examples of output devices that may be used to provide a user interface include printers or display screens for visual presentation of output and speakers or other sound generating devices for audible presentation of output. Examples of input devices that may be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks or wired networks.

Computer-executable instructions may be in many forms, such as program modules, executed by one or more computers or other devices. Generally, program modules include routines, programs, objects, components, data structures, etc. that performs particular tasks or implement particular abstract data types. Typically, the functionality of the program modules may be combined or distributed as desired in various embodiments.

The terms "program" or "software" are used herein in a generic sense to refer to any type of computer code or set of computer-executable instructions that may be employed to program a computer or other processor to implement various aspects as described above. Additionally, it should be appreciated that according to one aspect, one or more computer programs that when executed perform methods of the present application need not reside on a single computer or processor, but may be distributed in a modular fashion among a number of different computers or processors to implement various aspects of the present application.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code may be executed on any suitable processor or collection of processors, whether provided in a single computer or distributed among multiple computers.

Computer program logic implementing all or part of the functionality described herein is embodied in various forms, including, but in no way limited to, a source code form, a computer executable form, a hardware description form, and various intermediate forms (for example, mask works, or forms generated by an assembler, compiler, linker, or locator). In an example, source code includes a series of computer program instructions implemented in various programming languages, such as an object code, an assembly language, or a high-level language such as OpenCL, RTL, Verilog, VHDL, Fortran, C, C++, JAVA, or HTML for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

In some embodiments, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc.

Other components such as external storage, additional sensors, controllers for audio/video display, and peripheral devices may be attached to the board as plug-in cards, via cables, or integrated into the board itself. In another example embodiment, the electrical circuits of the FIGURES may be implemented as standalone modules (e.g., a device with associated components and circuitry configured to perform a specific application or function) or implemented as plug-in modules into application-specific hardware of electronic devices.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this disclosure.

In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

INTERPRETATION OF TERMS

All definitions, as defined and used herein, should be understood to control over dictionary definitions, definitions in documents incorporated by reference, and/or ordinary meanings of the defined terms. Unless the context clearly requires otherwise, throughout the description and the claims:

"comprise," "comprising," and the like are to be construed in an inclusive sense, as opposed to an exclusive or exhaustive sense; that is to say, in the sense of "including, but not limited to".

"connected," "coupled," or any variant thereof, means any connection or coupling, either direct or indirect, between two or more elements; the coupling or connection between the elements can be physical, logical, or a combination thereof.

"herein," "above," "below," and words of similar import, when used to describe this specification shall refer to this specification as a whole and not to any particular portions of this specification.

"or," in reference to a list of two or more items, covers all of the following interpretations of the word: any of the items in the list, all of the items in the list, and any combination of the items in the list.

the singular forms "a", "an" and "the" also include the meaning of any appropriate plural forms.

Words that indicate directions such as "vertical", "transverse", "horizontal", "upward", "downward", "forward", "backward", "inward", "outward", "vertical", "transverse", "left", "right", "front", "back", "top", "bottom", "below", "above", "under", and the like, used in this description and any accompanying claims (where present) depend on the specific orientation of the apparatus described and illustrated. The subject matter described herein may assume various alternative orientations. Accordingly, these directional terms are not strictly defined and should not be interpreted narrowly.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined.

Elements other than those specifically identified by the "and/or" clause may optionally be present, whether related or unrelated to those elements specifically identified. Thus, as a non-limiting example, a reference to "A and/or B", when used in conjunction with open-ended language such as "comprising" may refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

As used herein, the term "between" is to be inclusive unless indicated otherwise. For example, "between A and B" includes A and B unless indicated otherwise.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke 35 U.S.C. § 112(f) as it exists on the date of the filing hereof unless the words "means for" or "steps for" are specifically used in the particular claims; and (b) does not intend, by any statement in the disclosure, to limit this disclosure in any way that is not otherwise reflected in the appended claims.

The present invention should therefore not be considered limited to the particular embodiments described above. Various modifications, equivalent processes, as well as numerous structures to which the present invention may be applicable, will be readily apparent to those skilled in the art to which the present invention is directed upon review of the present disclosure.

What is claimed is:

1. A sample-by-sample bypass noise splitter, comprising:
a noise splitting module configured to split an input signal into a plurality of split signals, wherein each of the plurality of split signals is smaller than the input signal, wherein the noise splitting module includes a first multiplexor to process a first output; and
a bypass line configured to pass the input signal directly through to an output line, wherein the bypass line includes a second multiplexor to process a second output and least significant bits of the input signal;
wherein signals above a selected threshold are directed to the noise splitting module and wherein signals below the selected threshold are directed to the bypass line.

2. The bypass noise splitter of claim 1, wherein the bypass line is configured to pass a set of least significant bits of the input signal through to the output line.

3. The bypass noise splitter of claim 1, wherein the plurality of split signals includes a first signal including least significant bits of the input signal and a second signal including most significant bits of the input signal.

4. The bypass noise splitter of claim 1, wherein the noise splitting module comprises a sigma delta loop configured to split the input signal.

5. The bypass noise splitter of claim 4, wherein:
the sigma delta loop is a one of a first order sigma delta loop and a higher-order sigma delta loop;
the sigma delta loop is configured to split the input signal into a plurality of component outputs; and
a sum of the plurality of component outputs equals the input signal.

6. The bypass noise splitter of claim 1, wherein the noise splitting module includes an adder configured to add a second signal to the input signal.

7. The bypass noise splitter of claim 6, wherein the adder is a first adder and wherein the noise splitting module includes a second adder and a quantizer configured to truncate a second adder output to provide a first output.

8. The bypass noise splitter of claim 7, wherein the noise splitting module includes a register configured to filter a quantizer output and further configured to feed back a filtered quantizer output and add the filtered quantizer output to a first adder output.

9. The bypass noise splitter of claim 8, wherein the register is configured to utilize a second adder on a subsequent cycle to add the filtered quantizer output to the first adder output.

10. The bypass noise splitter of claim 1, wherein the bypass line further comprises a third adder configured to process the input signal and a first output to generate a second output.

11. The bypass noise splitter of claim 1, wherein when signals are below the selected threshold, the noise splitting module is disabled and the first multiplexor is configured to output a zero, and the second multiplexor is configured to output the least significant bits of the input signal.

12. The bypass noise splitter of claim 1, wherein when signals are below the selected threshold, the noise splitting module is disabled.

13. The bypass noise splitter of claim 12, further comprising a hold-off module, wherein signals below the selected threshold are directed to the hold-off module, and wherein the hold-off module is configured to postpone disabling the noise splitting module for a selected time period.

14. The bypass module of claim 1, wherein a first split signal of the plurality of split signals includes a first number of least significant bits, wherein the bypass line is configured to pass through a second number of least significant bits of the input signal, and wherein the first number of least significant bits is different from the second number of least significant bits.

15. A converter having enhanced noise performance, comprising:
an interpolator configured to receive an input signal;
a noise splitter including a noise splitting module and a bypass line, configured to receive an interpolated signal and output a plurality of parallel output signals;
a plurality of rotational scramblers coupled to the noise splitter configured to apply discrete element modeling to each of the plurality of parallel output signals and output a respective plurality of DEM output signals; and
a plurality of digital-to-analog converters (DACs) coupled to the rotational scramblers configured to convert each of the plurality of DEM output signals to a respective analog signal;
wherein the noise splitter is a sample-to-sample bypass splitter, and wherein signals above a selected threshold are directed to the noise splitting module and wherein signals below the selected threshold are directed to the bypass line.

16. The converter of claim 15, wherein when signals are below the selected threshold, the noise splitter is configured to disable the noise splitting module.

17. The converter of claim 16, wherein the noise splitter includes a hold-off module, wherein signals below the selected threshold are directed to the hold-off module, and wherein the hold-off module is configured to postpone disabling the noise splitting module for a selected time period.

18. A method for a sample-by-sample bypass noise splitter, comprising:
receiving an input signal;
determining whether the input signal is above a selected threshold;
when the input signal is above the selected threshold:
splitting the input signal into a plurality of split signals, wherein each of the plurality of split signals is smaller than the input signal, and
processing a first output at a first multiplexor; and
when the input signal is below the selected threshold:
passing the input signal directly through to an output line, and
processing a second output and least significant bits of the input signal at a second multiplexor.

19. The method of claim 18, wherein passing the input signal directly through to the output line comprises passing a set of least significant bits of the input signal through to the output line.

20. The method of claim 18, wherein when the input signal is below the selected threshold, outputting a zero from the first multiplexor, and outputting the least significant bits of the input signal at the second multiplexor.

* * * * *